(12) United States Patent
Jain et al.

(10) Patent No.: US 11,929,399 B2
(45) Date of Patent: Mar. 12, 2024

(54) DEEP NWELL CONTACT STRUCTURES

(71) Applicant: GlobalFoundries U.S. Inc., Malta, NY (US)

(72) Inventors: Navneet K. Jain, Milpitas, CA (US); Mahbub Rashed, Cupertino, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 52 days.

(21) Appl. No.: 17/687,941

(22) Filed: Mar. 7, 2022

(65) Prior Publication Data
US 2023/0282707 A1    Sep. 7, 2023

(51) Int. Cl.
*H01L 29/10*  (2006.01)
*H01L 27/12*  (2006.01)
*H01L 29/06*  (2006.01)
*H01L 29/78*  (2006.01)

(52) U.S. Cl.
CPC ...... *H01L 29/1087* (2013.01); *H01L 27/1203* (2013.01); *H01L 29/0692* (2013.01); *H01L 29/7838* (2013.01)

(58) Field of Classification Search
CPC ............ H01L 27/1203; H01L 29/1087; H01L 29/7838; H01L 29/78648; H01L 29/4983
USPC .......................................... 257/348; 438/252
See application file for complete search history.

(56) References Cited

U.S. PATENT DOCUMENTS

| | | | |
|---|---|---|---|
| 7,005,708 B2 | 2/2006 | Mergens et al. | |
| 7,049,699 B1 | 5/2006 | Masleid et al. | |
| 7,098,512 B1 | 8/2006 | Pelham et al. | |
| 8,146,037 B2 | 3/2012 | Pelham et al. | |
| 10,909,298 B1 | 2/2021 | Chan et al. | |
| 11,011,615 B2 | 5/2021 | Imthurn | |
| 2009/0140371 A1* | 6/2009 | Okamoto | H01L 21/743 257/499 |
| 2016/0359016 A1 | 12/2016 | Imthum | |
| 2018/0138203 A1* | 5/2018 | Zang et al. | H01L 27/1203 |

* cited by examiner

*Primary Examiner* — Thinh T Nguyen
(74) *Attorney, Agent, or Firm* — David Cain; Hoffman Warnick LLC

(57) ABSTRACT

Integrated structures include (among other components) a deep well structure having a first impurity, well rows contacting the deep well structure and having a second impurity, a well contact ring enclosing the well rows within an enclosed area, a transistor layer on the well rows, transistors within the transistor layer, and at least one ring-enclosed contact contacting the deep well structure. The ring-enclosed contact is positioned within the enclosed area. Such structures further include a well contact connection contacting the well contact ring and the ring-enclosed contact.

20 Claims, 10 Drawing Sheets

DEEP NWELL CONTACT STRUCTURES

BACKGROUND

Field of the Invention

The present disclosure relates to transistor devices, and more specifically, to contact structures within transistor devices.

Description of Related Art

Transistor devices use differently doped regions (different polarity doping) to provide opposite type transistors. Some structures use an underlying layer (sheet) that has one polarity doping with overlying oppositely doped rows. Such differently doped structures are used to bias transistors to achieve different operational effects.

SUMMARY

According to one embodiment herein, structures herein include (among other components) a deep well structure having a first impurity. Such structures further include well rows contacting the deep well structure and having a second impurity. Such structures further include a well contact ring enclosing the well rows within an enclosed area. Such structures further include a transistor layer on the well rows. Such structures further include transistors within the transistor layer. Such structures further include at least one ring-enclosed contact contacting the deep well structure. The ring-enclosed contact is positioned within the enclosed area. Such structures further include a well contact connection contacting the well contact ring and the ring-enclosed contact.

According to another embodiment herein, structures herein include (among other components) a deep well structure having a first impurity. Such structures further include well rows extending from the deep well structure. The well rows have a second impurity and, the first impurity and the second impurity have opposite polarities. Such structures further include isolation structures extending from the deep well structure in areas between the well rows. The isolation structures physically contact the well rows, and the isolation structures insulate adjacent well rows from each other. Such structures further include a well contact ring extending from the deep well structure. The well contact ring encloses an enclosed area. The well rows are within the enclosed area. Such structures further include a transistor layer comprising a dielectric material on the well rows and the isolation structures. Such structures further include transistors within the transistor layer. Adjacent ones of the transistors have opposite polarities. Such structures further include at least one ring-enclosed contact extending from the deep well structure. The ring-enclosed contact is positioned within the enclosed area. Such structures further include a well contact connection connected to the well contact ring and the ring-enclosed contact. The well contact connection is positioned on the transistor layer.

According to another embodiment herein, structures herein include (among other components) a deep well structure having a first impurity. The deep well structure is positioned in a first layer. Such structures further include well rows extending from the deep well structure. The well rows are positioned in a second layer parallel to the first layer. The well rows have a second impurity. The first impurity and the second impurity have opposite polarities. Such structures further include isolation structures extending from the deep well structure in areas between the well rows. The isolation structures are within the second layer. The isolation structures physically contact the well rows, and the isolation structures insulate adjacent well rows from each other. Such structures further include a well contact ring extending from the deep well structure. The well contact ring is within the second layer. The well contact ring encloses an enclosed area. The well rows are within the enclosed area. Such structures further include a transistor layer positioned in a third layer parallel to the first layer and second layer. The transistor layer comprises a dielectric material. The second layer is between the first layer and the third layer. Such structures further include transistors within the transistor layer. Adjacent ones of the transistors have opposite polarities. Such structures further include at least one ring-enclosed contact extending from the deep well structure. The ring-enclosed contact is positioned within the enclosed area. Such structures further include a well contact connection connected to the well contact ring and the ring-enclosed contact. The well contact connection is positioned on the transistor layer in a fourth layer parallel to the first layer, second layer, and third layer, and the third layer is between the second layer and the fourth layer.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, differently doped structures are used within integrated circuit structures to bias transistors to achieve different operational effects. Some structures that include a sheet-type deep well structure use a continuous contact, such as a ring contact, to connect electrically to the deep well structure where the ring contact surrounds groups of transistors. These groups of transistors enclosed within the ring contact can operate as an independent system or system-on-chip (SOC) or operate as other similar devices.

In some situations, when ring contact structures are used to bias a sheet-type deep well structure, the bias voltage can be inconsistent at different locations within the sheet-type deep well structure. The bias voltage can change as distances from the ring contact increase. The structures described herein address such issues by using one or more additional contacts located within the ring-enclosed area. With these structures, a connecting conductor connects such enclosed contacts to the ring contact.

Figure 1A:
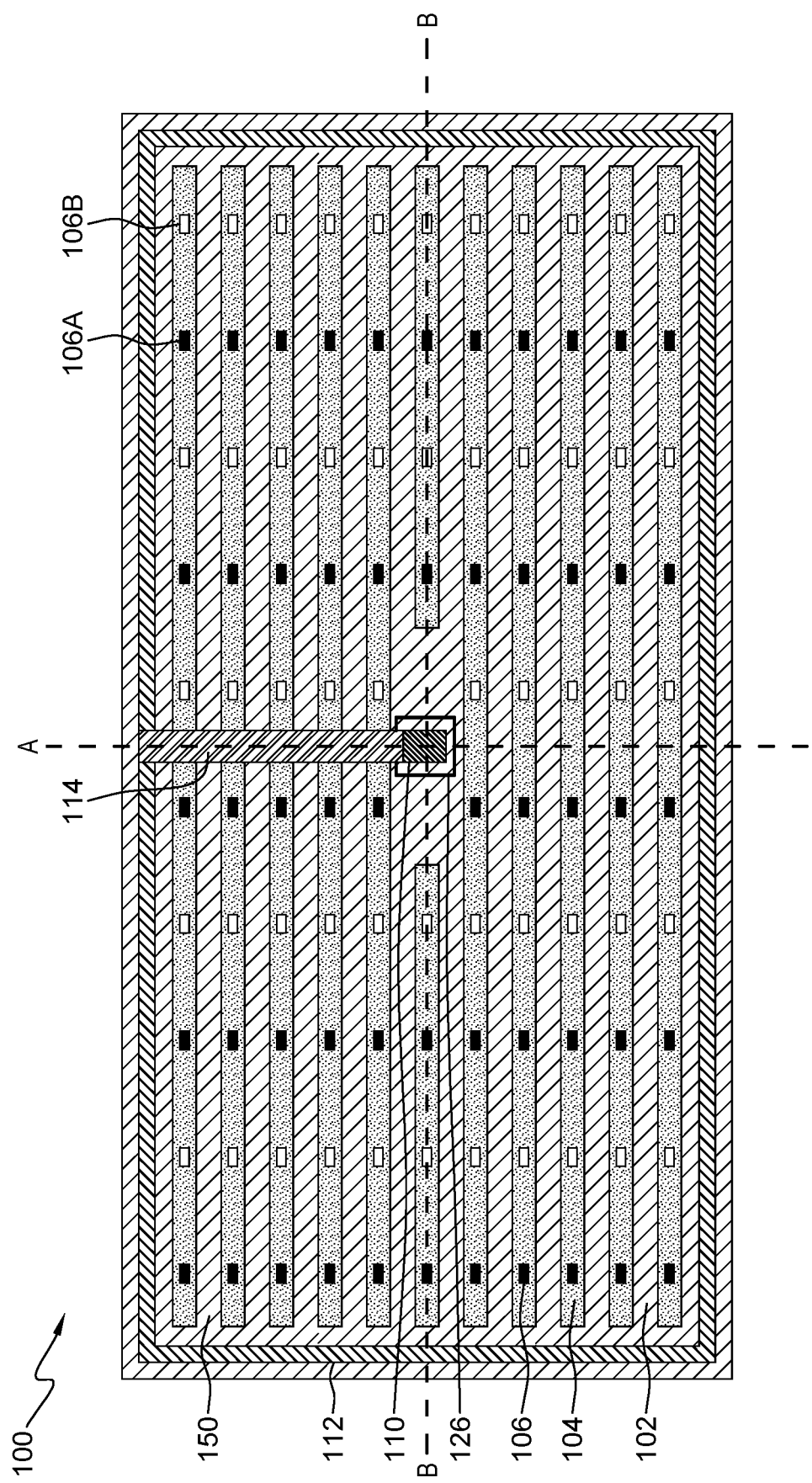
FIG. 1A is a top-view schematic diagram illustrating an integrated circuit structure according to embodiments herein.
Figure 1B:
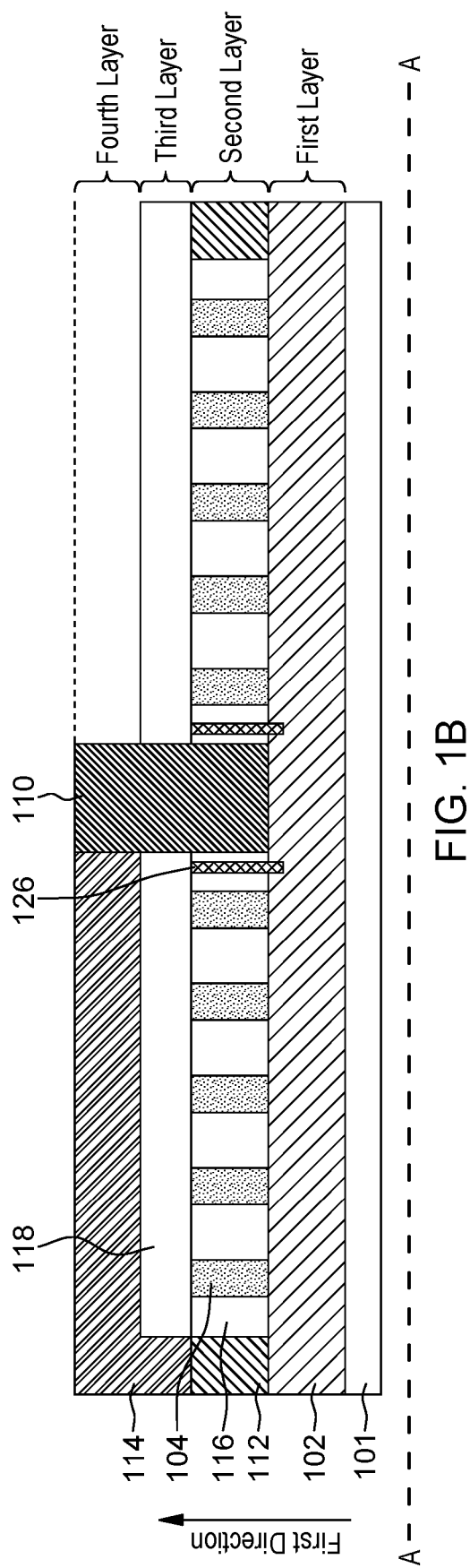
FIGS. 1B-1D are cross-sectional view schematic diagrams along lines A-A and B-B shown in FIG. 1A illustrating an integrated circuit structure according to embodiments herein.
Figure 1C:
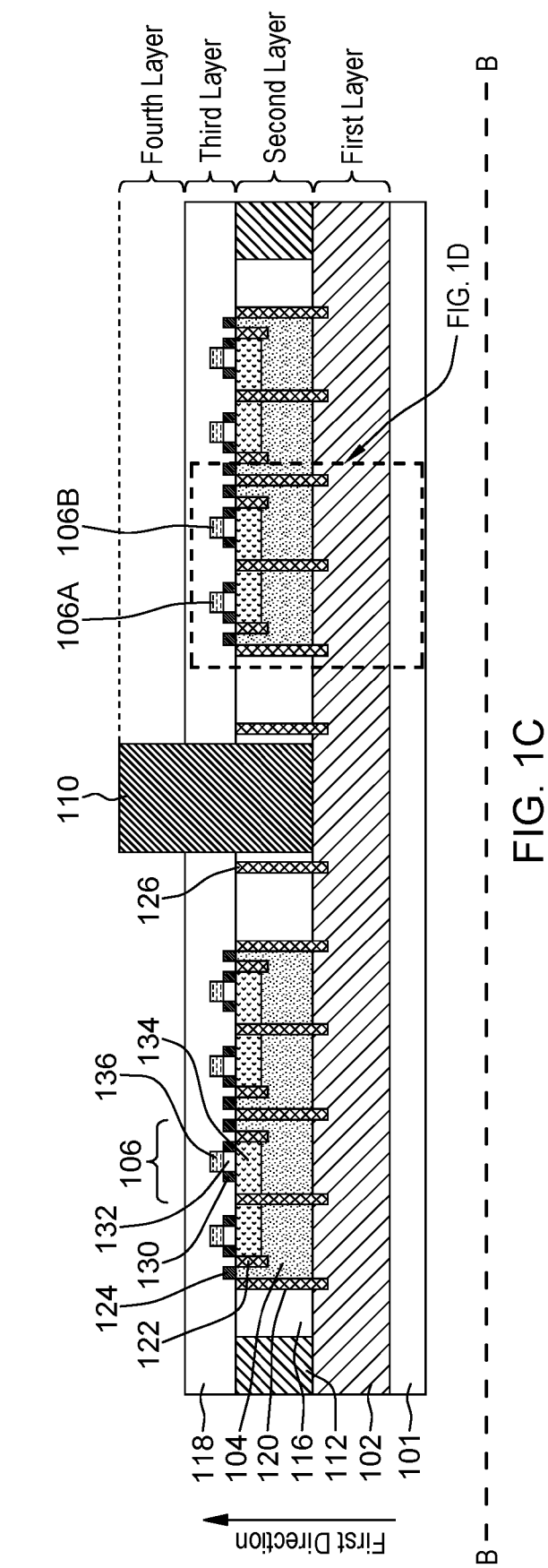
Figure 1D:
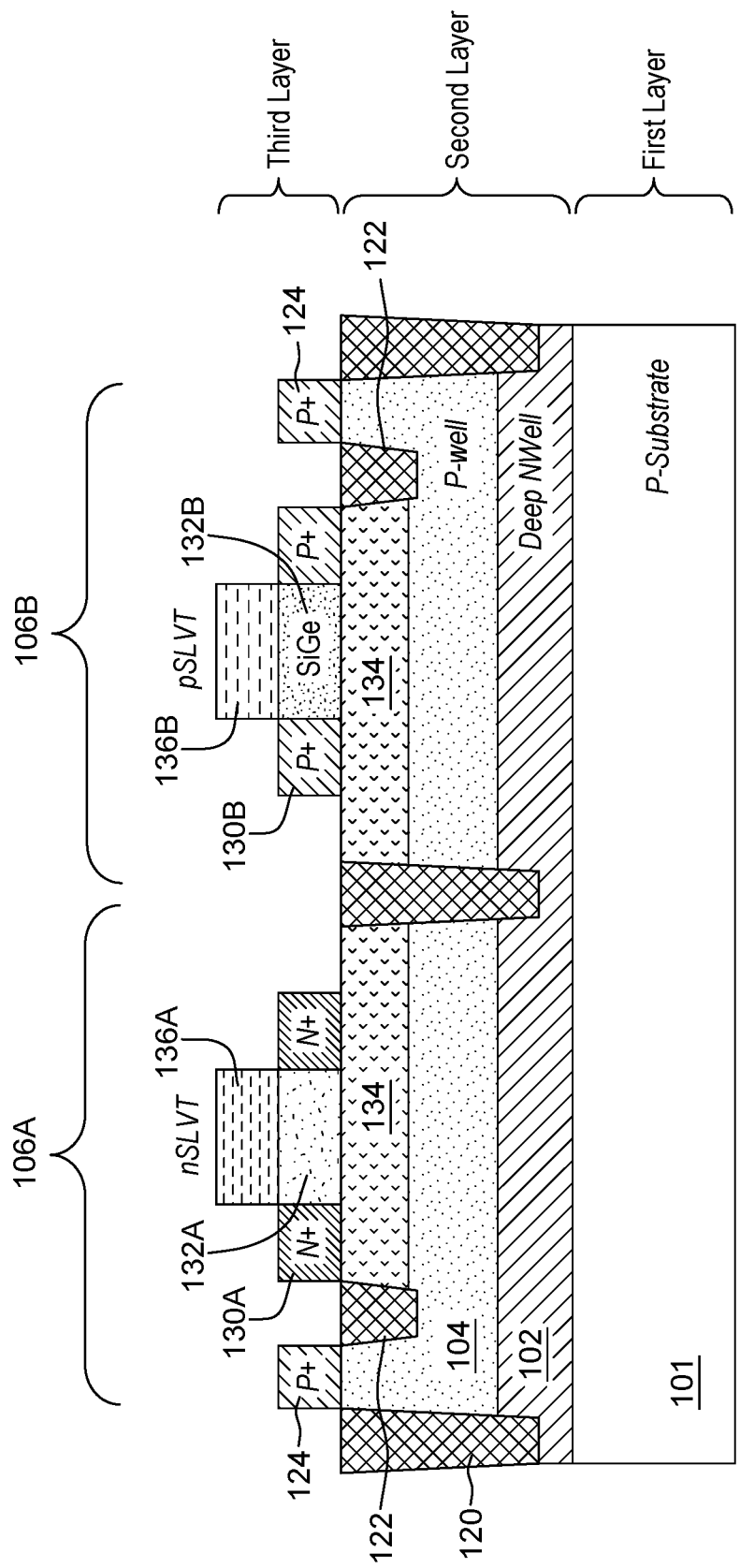

Referring now to the accompanying drawings, FIGS. 1A-1D illustrate an exemplary structure herein. More specifically, FIG. 1A is a top-view schematic diagram illustrating an integrated circuit structure 100 according to embodiments herein. FIGS. 1B-1C are cross-sectional view schematic diagrams, respectively along lines A-A and B-B shown in FIG. 1A, illustrating portions of the same integrated circuit structure 100. FIG. 1D is a cross-sectional view schematic diagram of a limited portion of FIG. 1C showing two complementary transistors 106A, 106B according to embodiments herein.

As shown in FIGS. 1A-1D, these structures 100 can include (among other components) one or more underlying substrates 101 and a deep well structure 102 having a first impurity on or in the substrate 101. The substrate 101 can be any appropriate material(s) and is commonly an undoped silicon material of sufficient structural rigidity to provide physical support to adjacent layers. As shown in FIGS. 1B-1D, the deep well structure 102 forms what is arbitrarily referred to as a "first" layer.

The deep well structure is sometimes referred to as a sheet or sheet-type structure because the deep well structure 102 is an unbroken, continuous layer that has a consistent doping concentration and impurity-type throughout. In some examples, the deep well structure 102 can exist as impurities within a semiconductor substrate. Such impurities create excessive valence electrons relative to the intrinsic semiconductor. In one example, the impurities can be an N-type or P-type. N-type impurities can include for example, antimony, arsenic, phosphorous, etc., while P-type impurities can include for example, boron, aluminum, gallium, etc.

Such structures 100 further include well rows 104 physically contacting, and extending upwardly (e.g., in an arbitrarily termed "first" direction shown in FIGS. 1B-1C) from, the deep well structure 102. In this arbitrary orientation terminology, the first direction moves from a relative bottom toward a relative top of the structure 100. Thus, in such arbitrary orientation designations FIGS. 1A and 2-8 are a "top-down" views and FIGS. 1B-1D are "side" or "cross-section" views relative to the top-down view. Using such arbitrary orientation terminology, the substrate 101 at a "bottom" and all other described features progress toward a "top" of the structure 100 relative to the "bottom." The structures herein do not have a required orientation and the terms top, bottom, side, etc., are used for convenience of discussion, have no absolute orientation meaning, and are only used to represent relative positions of different components.

Similarly, FIGS. 1B-1C the well rows 104 are positioned in an arbitrarily named "second" layer that is immediately adjacent to and parallel to the first layer. The well rows 104 have a second impurity that is opposite the polarity of the first impurity. Therefore, if the deep well structure 102 is a N-type layer, the well rows are P-type rows and, conversely, if the deep well structure 102 is a P-type layer, the well rows are N-type rows.

Such integrated circuit structures 100 further include isolation structures 116 that also physically contact and extend from the deep well structure 102 in the first direction. The isolation structures 116 are located in areas between the well rows 104, are insulators. The well rows 104 and the isolation structures 116 extend in the first direction from the deep well structure the same distance (height). As shown, the isolation structures 116 are also within the second layer. The isolation structures 116 physically contact the well rows 104, and the isolation structures 116 insulate adjacent well rows 104 from each other.

Such structures 100 further include a well contact ring 112 (a conductor) physically contacting, and extending in the first direction from, the deep well structure 102. The well contact ring 112 is also within the second layer. The well contact ring 112 encloses an "enclosed area" or "ring-enclosed area" 150. All the well rows 104 are only (i.e., fully) within the ring-enclosed area 150 (e.g., do not extend through the well contact ring 112) and are insulated from the well contact ring 112 by the isolation structures 116.

Such structures 100 further include a transistor layer 118 positioned in a third layer that is parallel to the first layer and second layer. As shown in FIGS. 1B-1D, the second layer is directly between the first layer and the third layer, with no other intervening layers. The transistor layer 118 comprises a dielectric material with transistors 106 therein.

Adjacent ones of the transistors 106 have opposite polarities as shown by identification numbers 106A and 106B. Specifically the A and B designations in the identification numbers represents opposite polarity doping. In one example, the transistors 106 can be silicon-on-insulator (SOI) structures in which a semiconductor layer is a silicon layer on a buried oxide (BOX) layer or some other suitable insulator layer. While one specific transistor structure is shown in the example in FIG. 1C-1D, items 106, 106A, and 106B in the drawings are intended to illustrate any form of transistor, such as bipolar junction transistors (BJT), field effect transistors (FET), etc.

The transistors 106, 106A, and 106B illustrated in FIGS. 1C-1D are FETs and include conductive source/drain regions 130, 130A, and 130B, channel regions 132, 132A, and 132B, and gate conductor 136, 136A, and 136B. In some embodiments, the transistors 106, 106A, and 106B can be SOI structures (e.g., a fully-depleted silicon-on-insulator (FDSOI) structure) where the channel regions 132, 132A, and 132B are undoped. In other alternatives the channel regions 132, 132A, and 132B can be doped with an impurity. Below each transistor 106, 106A, and 106B is an isolation region 134 (e.g., an insulator) within the upper region of the well rows 104.

The transistors 106 are isolated by dual-depth shallow trench isolation (STI) structures 120, 122. The dual-depth STI structures 120, 122 are insulators. The relatively deeper (dual-depth) STI structures 120 extend into the deep well structure 102. The relatively deeper (dual-depth) STI structures 120 form a deep fence (DFE) structure that isolates an individual section of the well rows 104 into transistor-specific sections. Well row contacts 124 allow an individual bias to be applied to each transistor-specific section of the well rows 104. The relatively more shallow STI structures 122 isolate the area of the well rows 104 that are adjacent to the well row contacts 124 from the isolation regions 134.

In the specific example shown in FIG. 1D, the substrate 101 has a P-type doping, the deep well sheet 102 has an N-type doping, the well rows 104 have a P-type doping, and the well row contacts 124 have a P+ type doping (relatively heaver P-type doping). The transistors are super-low threshold voltage (SLVT) N-type (106A) and P-type (106B) transistors (nSLVT 106A and pSLVT 106B, respectively). The nSLVT 106A includes relatively heaver N-type doped source/drain regions 130A, an undoped fully-depleted SOI channel region 132A, and an N-type gate conductor 136A. The pSLVT 106B includes relatively heaver P-type doped source/drain regions 130B, a germanium-doped silicon channel region 132B, and a P-type gate conductor 136B. Again, this is just an example and the structures herein can be used with any types of transistor structures.

As noted above, the deep well structure 102 is a uniform, continuous, unbroken sheet that is biased by the bias applied to the well contact ring 112. Therefore, all areas of the deep well structure 102 have the same bias; however, this bias decreases as distances from the well contact ring 112 increase. This is contrasted by the well rows 104 where each alternative section (between the deeper STI structures 120) within each of the well rows 104 can be distinctively biased by each individual well row contact 124. Because alternating transistors 106 can be opposite polarity devices in this structure 100, the alternating sections within each of the well rows 104 can be similarly alternatively biased by supplying alternating bias to the alternating well row contacts 124 along each well row 104.

As mentioned above, one issue with such structures is that the bias of the uniform, continuous, unbroken sheet of the deep well structure 102 can be different based upon factors such as the distance from the well contact ring 112. Thus, there can be an irregular biasing voltage pattern in the deep well structure 102 (within the ring-enclosed area 150). In view of such issues, the structures 100 herein further include at least one ring-enclosed contact 110 (so named because it is within the area enclosed by the well contact ring 112), which is a conductor and extends in the first direction from the deep well structure 102. An additional deep fence structure 126 can surround and electrically isolate (insulate) the ring-enclosed contact 110.

The ring-enclosed contact 110 is positioned to interrupt one of the well rows 104. Such interrupted well rows 104 are not continuous within the ring-enclosed area 150. The ring-enclosed contact 110 extends from the deep well structure 102 a greater distance (height) relative to the distance the well row 104 and isolation structures 116 extend in the first direction from the deep well structure 102. As shown in FIGS. 1B-1C, the well contact ring 112 is located only within the second layer, while the ring-enclosed contact 110 extends from the deep well structure 102 through the second layer and the third layer into the fourth layer. In one example, the ring-enclosed contact 110 extends at least 50% more, twice as far, three times as far, etc., from the deep well structure 102 relative to how far the well row 104 and isolation structures 116 extend from the deep well structure 102.

Also, as shown in FIGS. 1A-1B, a well contact connection 114 is connected to (and electrically connects) the well contact ring 112 and the ring-enclosed contact 110. The well contact connection 114 is positioned on the insulator portion of the transistor layer 118 in a fourth layer that is parallel to the first layer, second layer, and third layer (wherein the third layer is between the second layer and the fourth layer). Thus, the well contact connection 114 extends from the well contact ring 112 in the first direction through the second layer and the third layer into the fourth layer, and the well contact connection 114 extends perpendicularly to the first direction within the fourth layer along the top surface of the transistor layer 118. Additional metallization layers that overly the structures illustrated (formed during back-end-of-line (BEOL) processing) can contact only the well contact ring 112, only the ring-enclosed contact 110, only the well contact connection 114, or any combination of the three.

As shown in the structure 100 illustrated in FIG. 1A, the ring-enclosed contact 110 is centered within the enclosed area 150 in order to help maintain the bias consistent throughout all of the deep well structure 102. In contrast, as shown in FIGS. 2-8, the structures herein can include a plurality of ring-enclosed contacts 110 and additional well contact connections 114. In such alternative structures, all the ring-enclosed contacts 110 are within the enclosed area 150. In some examples (e.g., such as those shown in FIGS. 5-8) the ring-enclosed contacts 110, 210 are positioned in a pattern within the enclosed area 150 that corresponds to the biasing voltage pattern. Note that cross-sectional view of the structures shown in FIGS. 2-8, would appear similar to the cross-sectional views shown in FIGS. 1B-1C and are not provided to avoid redundancy.

Figure 2:
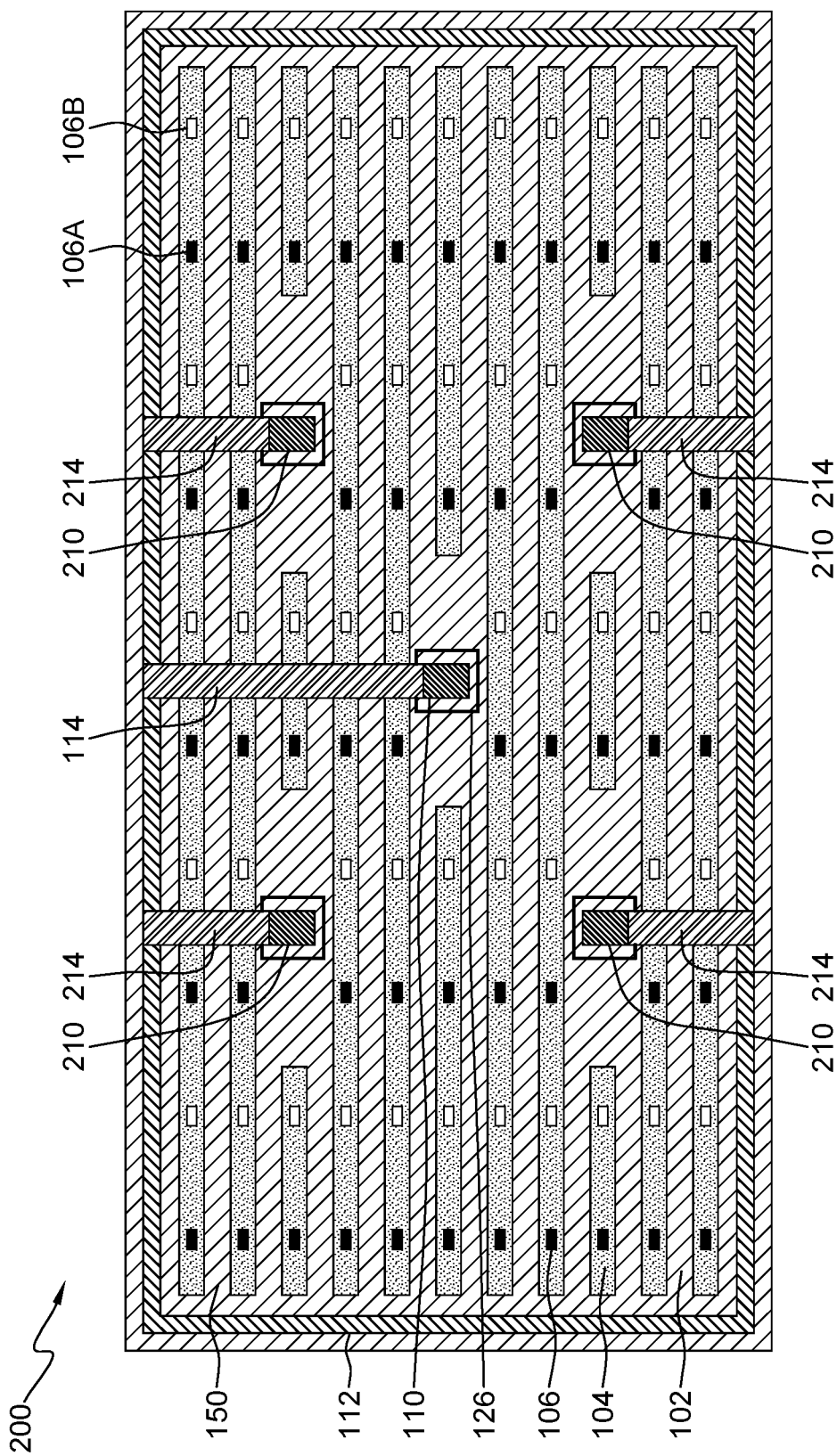
FIGS. 2-8 are top-view schematic diagrams illustrating integrated circuit structures according to embodiments herein.

More specifically, in the integrated circuit structure 200 shown in FIG. 2, a centered ring-enclosed contact 110 is positioned at the area-based center of the enclosed area 150, and the other ring-enclosed contacts 210 and associated well contact connections 214 are distributed evenly (on an area basis) within the enclose area 150. In the structure shown in FIG. 2, the enclosed area 150 can be logically divided into equal quadrants and the four ring-enclosed contacts 210 are centered within one of the quadrants of the enclosed area 150. As shown, such ring-enclosed contacts 210 are separated from each other and the center ring-enclosed contact 210 by a spacing greater than twice the width of one of the well rows 104.

Figure 3:
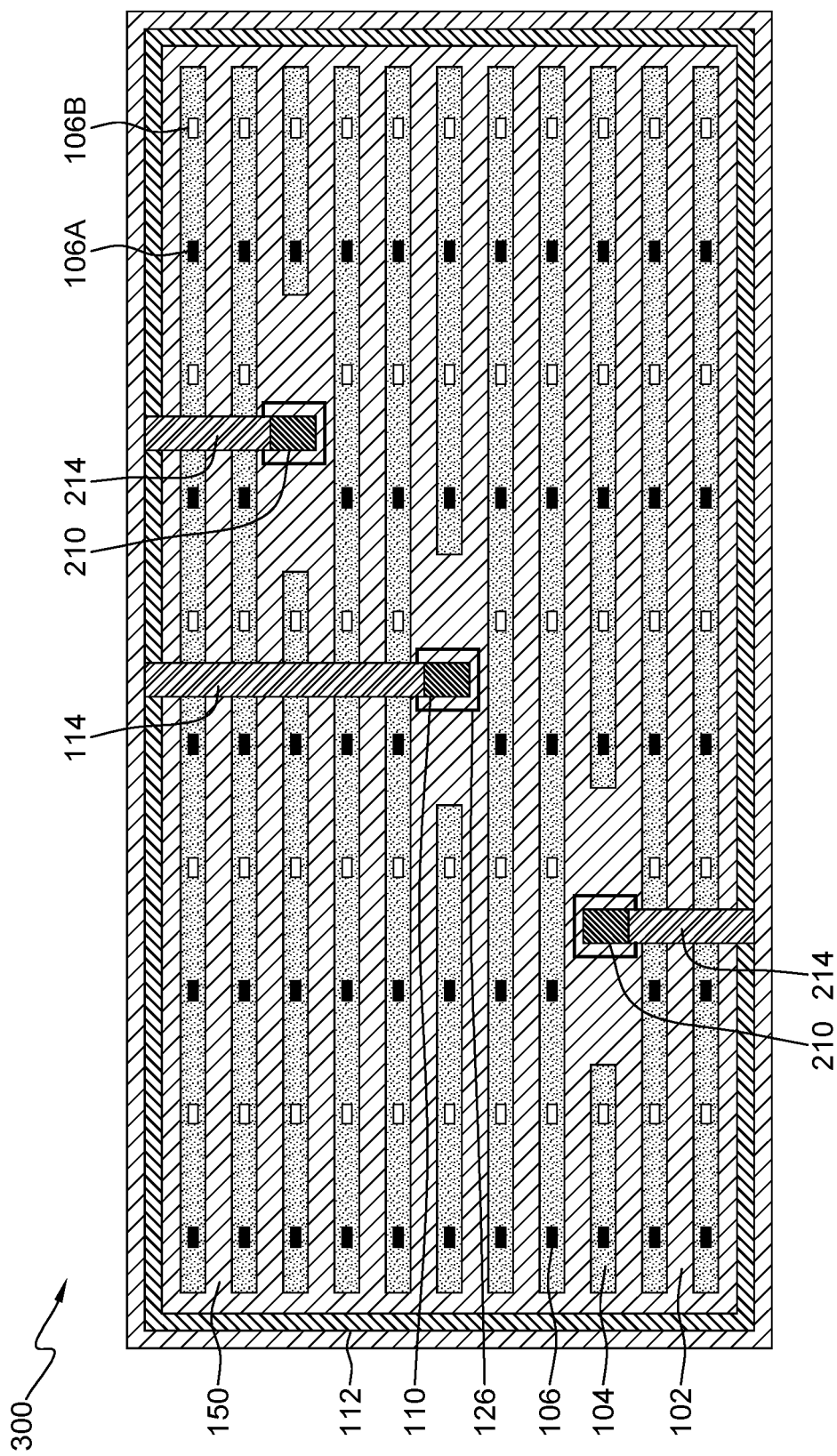

FIG. 3 illustrates an alternative structure 300 where a center ring-enclosed contact 110 is positioned at the center of the enclosed area 150, and the other ring-enclosed contacts 210 and associated well contact connections 214 are positioned in opposite halves of the enclosed area 150 (where the opposite halves of the enclosed area 150 are separated by the center ring-enclosed contact 110). In the structure 300 in FIG. 3, one or more of the other ring-enclosed contacts 210 are positioned in two diagonally opposed quadrants of the enclosed area 150. In this specific structure 300, the center ring-enclosed contact 110 and other ring-enclosed contacts 210 are all positioned along a single diagonal line that is diagonal relative to the perpendicular sides of the well contact ring 112.

Figure 4:
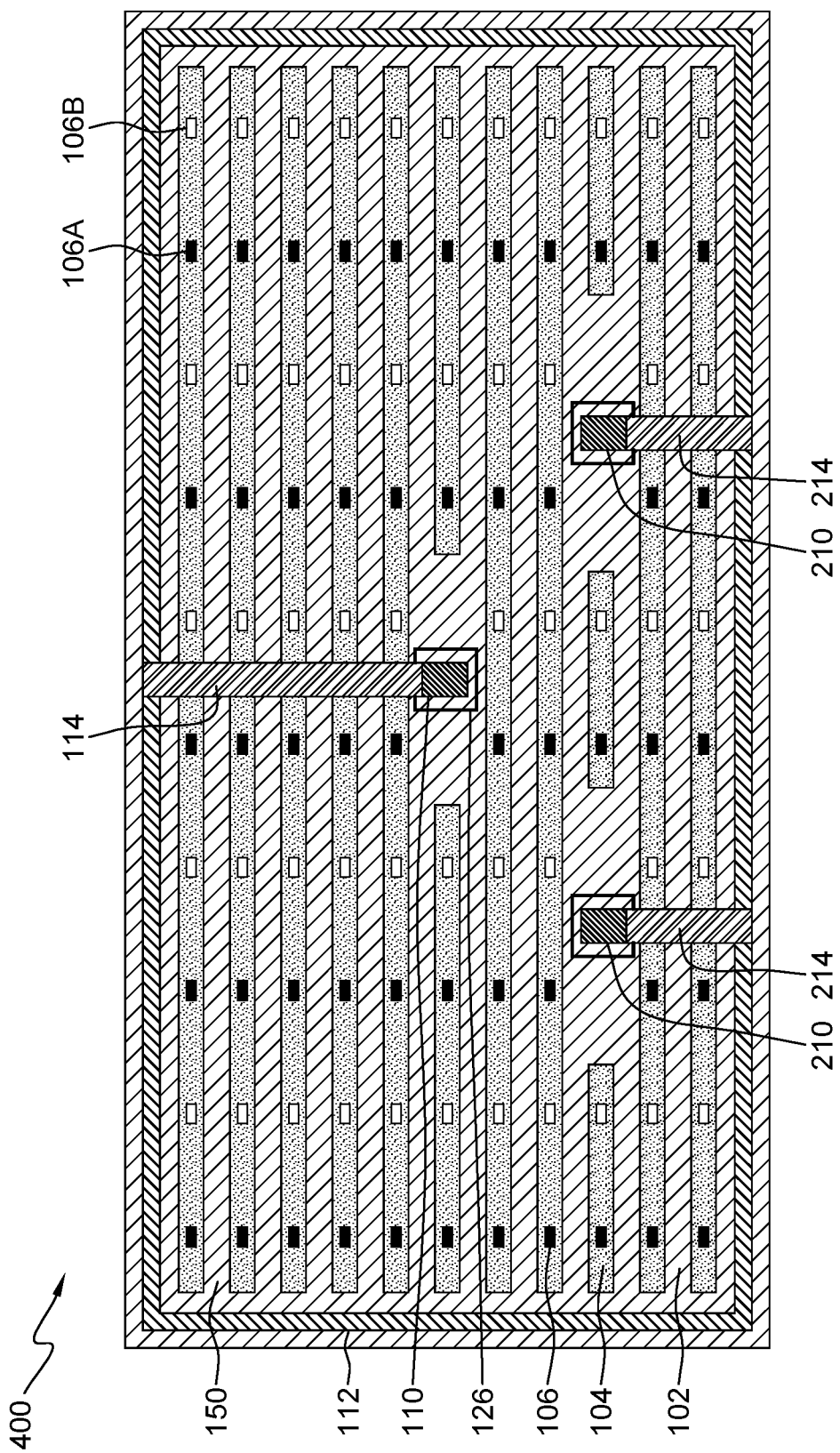
Figure 5:
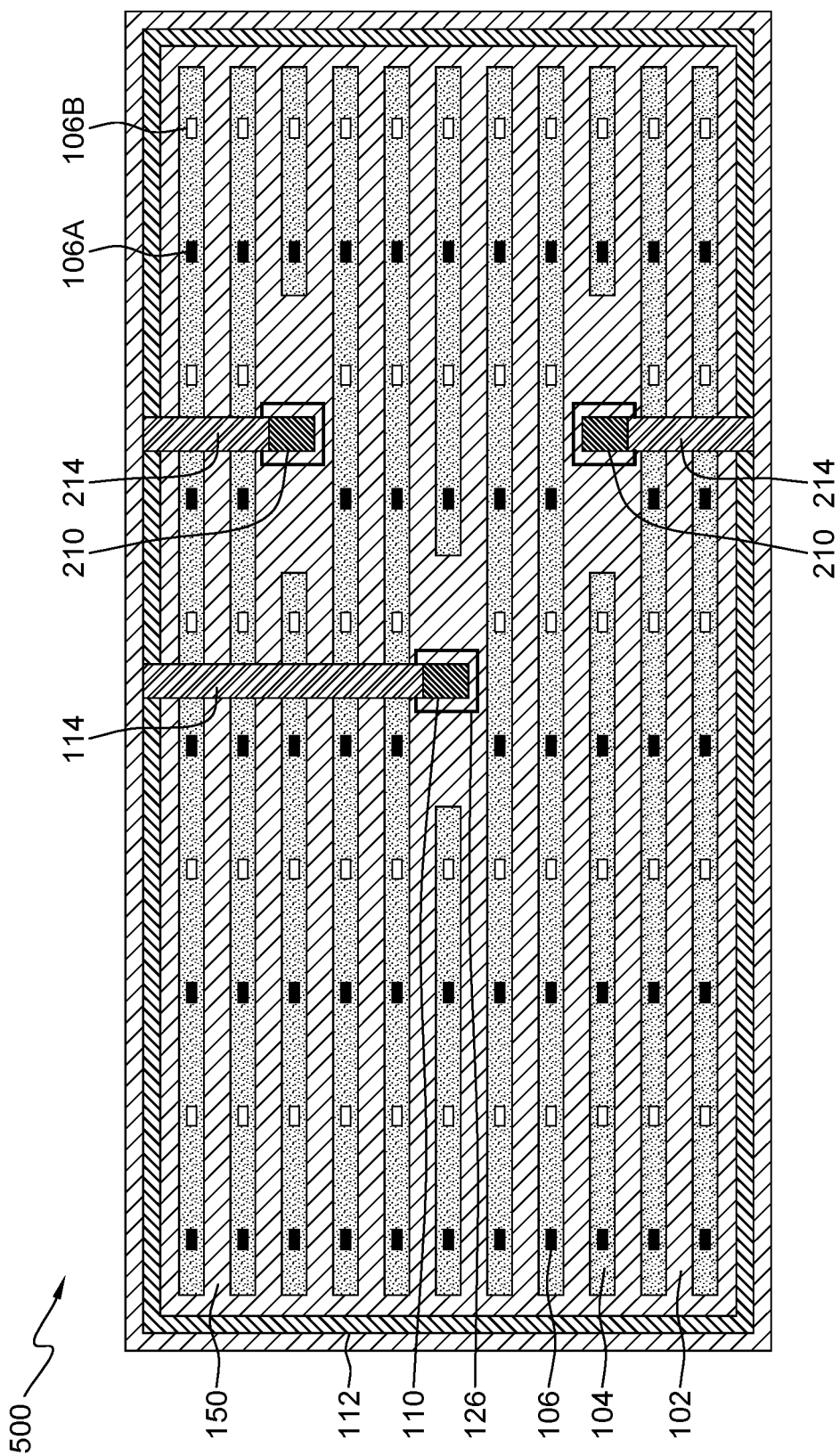

FIGS. 4 and 5 illustrate alternative structures 400, 500 where a center ring-enclosed contact 110 is positioned at the center of the enclosed area 150, and the other ring-enclosed contacts 210 and associated well contact connections 214 are positioned within one-half of the enclose area 150. In such structures 400, 500, all the associated well contact connections 214 of the other ring-enclosed contacts 210 are connected to the same side of the well contact ring 112. Stated differently, in the structures 400, 500 shown in FIGS. 4 and 5, the other ring-enclosed contacts 210 and associated well contact connections 214 are positioned between one of the sides of the well contact ring 112 and the center ring-enclosed contact 110.

Figure 6:
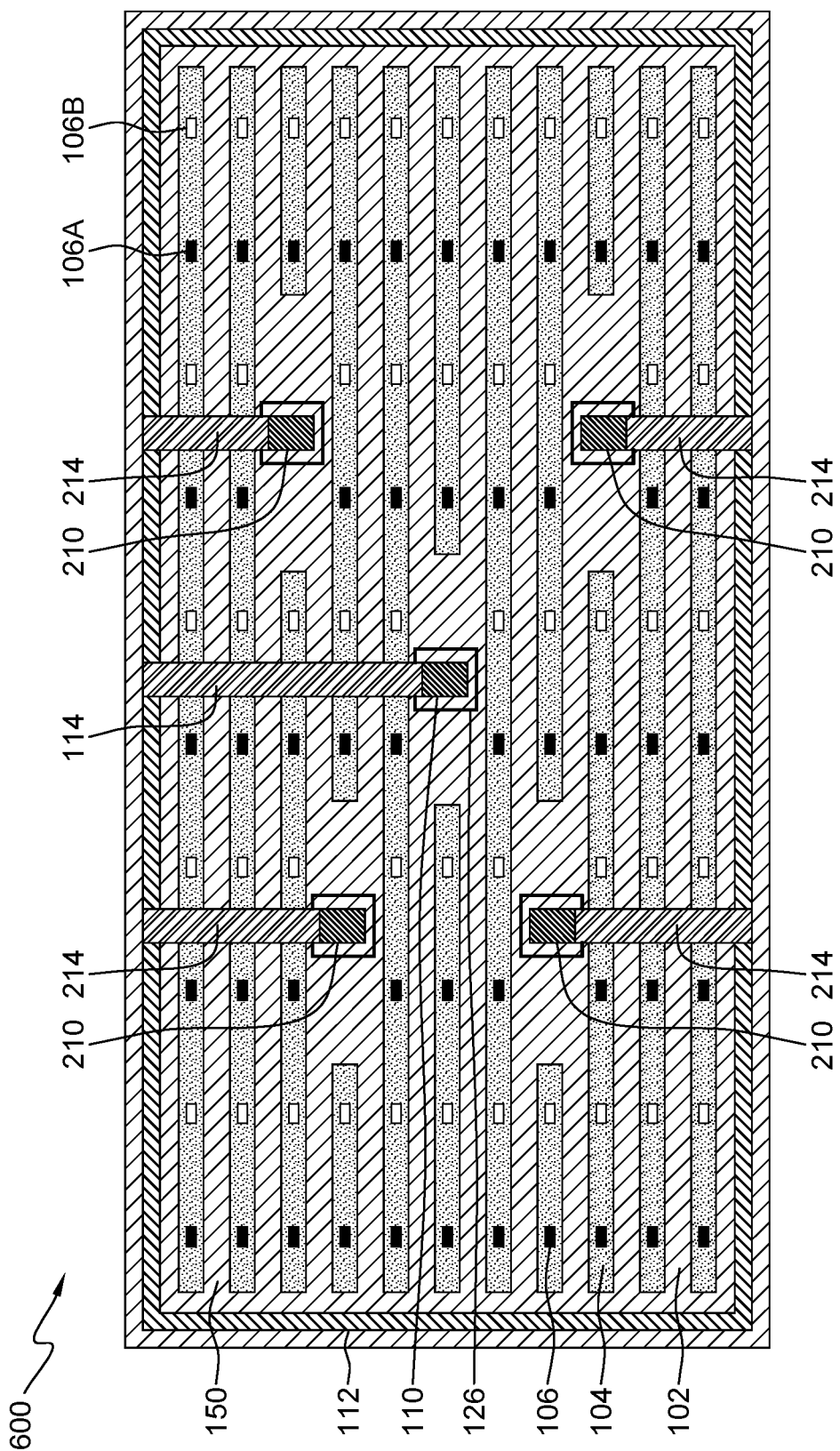

FIG. 6 illustrates a structure 600 that is similar to the structure 200 shown in FIG. 2 (where the other ring-enclosed contacts 210 are distributed evenly within the quadrants of the enclosed area 150); however, in the structure 600 shown in FIG. 6, the associated well contact connections 214 are different lengths (extend different distances from one side of the well contact ring 112). Thus, with the structure 600 shown in FIG. 6, at least two of the associated well contact connections 214 extend different distances from the same side of the well contact ring 112.

Figure 7:
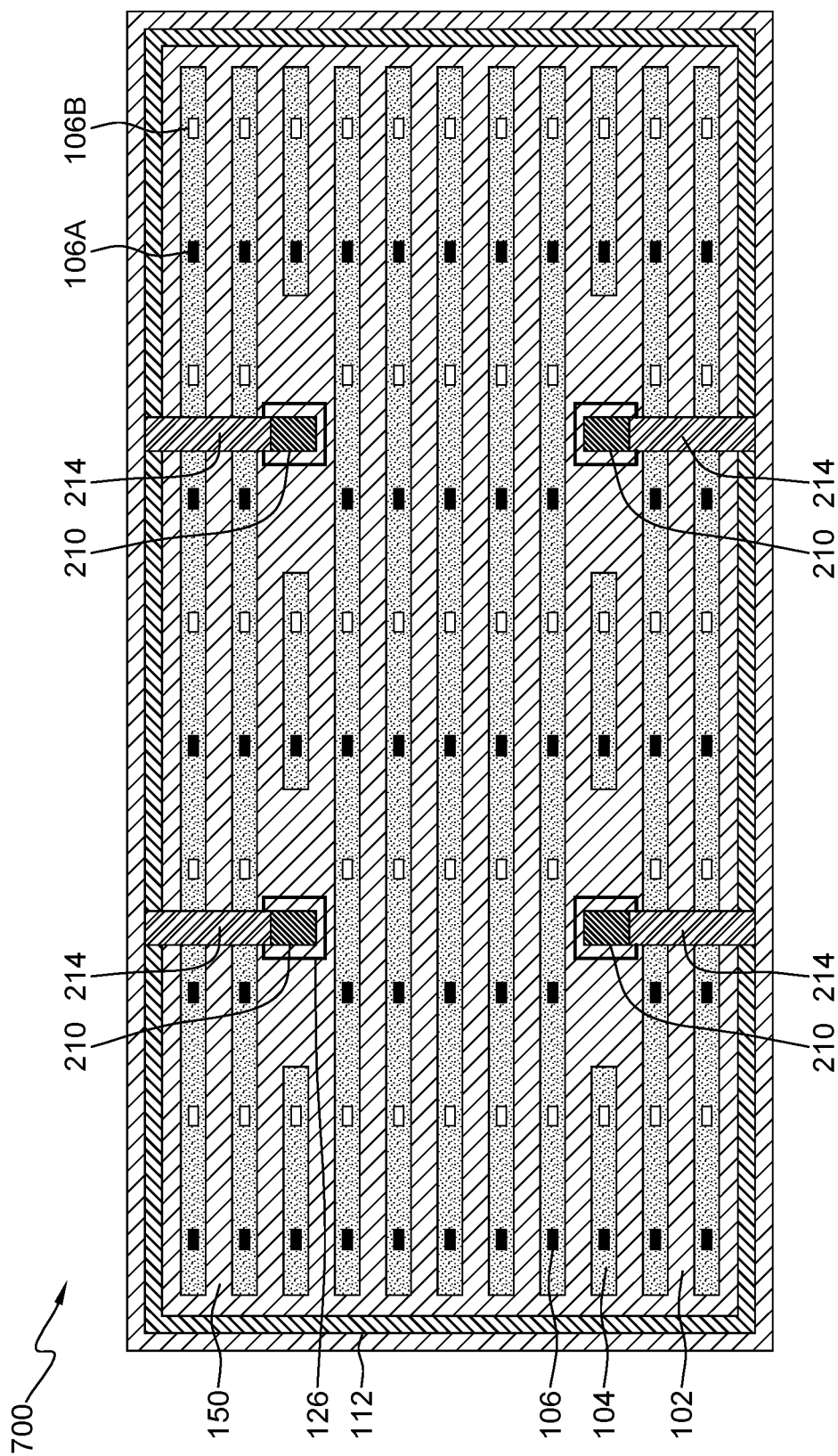

FIG. 7 illustrates a structure 700 that is similar to the structure 200 shown in FIG. 2 (where the other ring-enclosed contacts 210 are distributed evenly within the quadrants of the enclosed area 150); however, in the structure 700 shown in FIG. 7 no center ring-enclosed contact 110 is present. Therefore, in FIG. 7, the ring-enclosed contacts 210 are all distributed evenly within the quadrants of the enclosed area 150. Again, such ring-enclosed contacts 210 are separated from each other and the center ring-enclosed contact 210 by a spacing greater than twice the width of one of the well rows 104.

Figure 8:
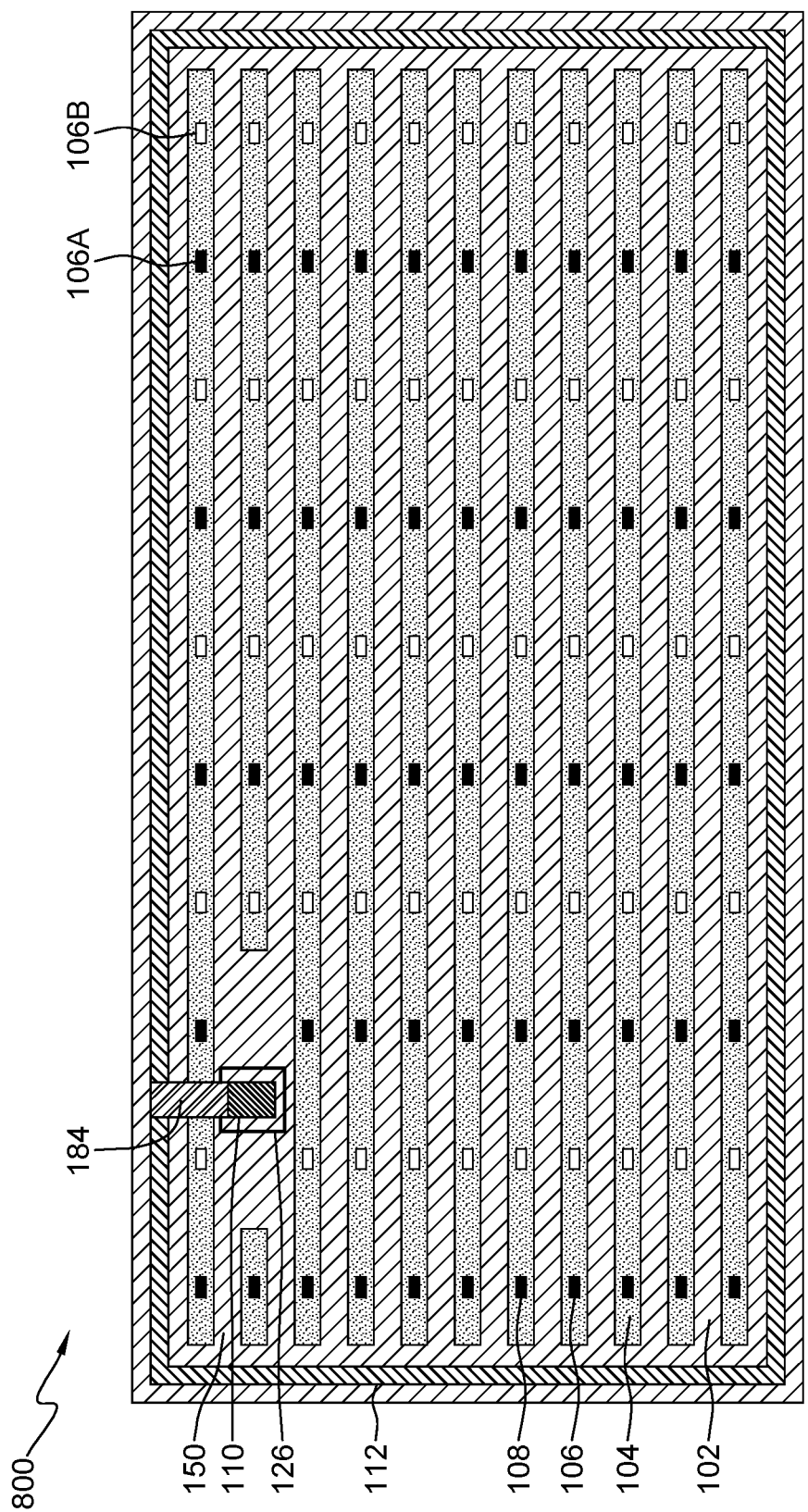

FIG. 8 illustrates an alternative structure 800 where a single, non-centered ring-enclosed contact 110 is positioned off center within the enclosed area 150. In the example shown in FIG. 8, the single ring-enclosed contact 110 is positioned within one of the quadrants of the enclosed area 150. This example shows that all the ring-enclosed contacts 110 can be positioned within a single quadrant of the enclosed area 150.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

Generally, transistor structures, in one example, can be formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. The "shallow trench isolation" (STI) structures are generally formed by patterning openings/trenches within the substrate and growing or filling the openings with a highly insulating material (this allows different active areas of the substrate to be electrically isolated from one another).

While only one or a limited number of transistors are illustrated in the drawings, those ordinarily skilled in the art would understand that many different types of transistors could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A structure comprising:
   a deep well structure having a first impurity;
   well rows above and contacting the deep well structure and having a second impurity;
   a well contact ring above and contacting the deep well structure and enclosing the well rows within an enclosed area;
   a transistor layer on the well rows;
   transistors within the transistor layer; and
   at least one ring-enclosed contact above and contacting the deep well structure, wherein the ring-enclosed contact is positioned within the enclosed area and has a greater height above the deep well structure than the well rows and the well contact ring.

2. The structure according to claim 1, wherein the at least one ring-enclosed contact comprises a plurality of ring-enclosed contacts, and wherein all the ring-enclosed contacts are within the enclosed area.

3. The structure according to claim 2, wherein a pattern of the ring-enclosed contacts within the enclosed area corresponds to a biasing voltage pattern in the deep well structure.

4. The structure according to claim 1, wherein the ring-enclosed contact extends from the deep well structure through the transistor layer.

5. The structure according to claim 1, further comprising a well contact connection connected to the well contact ring and the ring-enclosed contact, wherein the well contact connection extends from the well contact ring through the transistor layer, and wherein the well contact connection extends along a surface of the transistor layer.

6. The structure of claim 1, wherein the ring-enclosed contact is positioned to interrupt one of the well rows.

7. The structure according to claim 1, wherein the at least one ring-enclosed contact comprises a center contact and a plurality of ring-enclosed contacts, wherein the center contact is positioned at a center of the enclosed area, and wherein the ring-enclosed contacts are separated from the center contact by a spacing greater than twice the width of one of the well rows.

8. A structure comprising:
   a deep well structure having a first impurity;
   well rows above and contacting the deep well structure, wherein the well rows have a second impurity, wherein the first impurity and the second impurity have opposite polarities;
   isolation structures extending from the deep well structure in areas between the well rows, wherein the isolation structures physically contact the well rows, and wherein the isolation structures insulate adjacent well rows from each other;
   a well contact ring above and contacting the deep well structure, wherein the well contact ring encloses an enclosed area, and wherein the well rows are within the enclosed area;
   a transistor layer comprising a dielectric material on the well rows and the isolation structures;
   transistors within the transistor layer, wherein adjacent ones of the transistors have opposite polarities;
   at least one ring-enclosed contact above and contacting the deep well structure, wherein the ring-enclosed contact is positioned within the enclosed area and has a greater height above the deep well structure than the well rows and the well contact ring; and
   a well contact connection connected to the well contact ring and the ring-enclosed contact ring, wherein the well contact connection is positioned on the transistor layer.

9. The structure according to claim 8, wherein the at least one ring-enclosed contact comprises a plurality of ring-enclosed contacts, and wherein all the ring-enclosed contacts are within the enclosed area.

10. The structure according to claim 9, wherein a pattern of the ring-enclosed contacts within the enclosed area corresponds to biasing voltage pattern in the deep well structure.

11. The structure according to claim 8, wherein the ring-enclosed contact extends from the deep well structure through the transistor layer.

12. The structure according to claim 8, wherein the well contact connection extends from the well contact ring through the transistor layer, and wherein the well contact connection extends along a surface of the transistor layer.

13. The structure according to claim 8, wherein the ring-enclosed contact is positioned to interrupt one of the well rows.

14. The structure according to claim 8, wherein the at least one ring-enclosed contact comprises a center contact and a plurality of ring-enclosed contacts, wherein the center contact is positioned at a center of the enclosed area, and wherein the ring-enclosed contacts are separated from the center contact by a spacing greater than twice the width of one of the well rows.

15. A structure comprising:
   a deep well structure having a first impurity, wherein the deep well structure is positioned in a first layer;
   well rows above and contacting the deep well structure, wherein the well rows are positioned in a second layer above and parallel to the first layer, wherein the well rows have a second impurity, wherein the first impurity and the second impurity have opposite polarities;
   isolation structures extending from the deep well structure in areas between the well rows, wherein the isolation structures are within the second layer, wherein the isolation structures physically contact the well rows, and wherein the isolation structures insulate adjacent well rows from each other;
   a well contact ring above and contacting the deep well structure, wherein the well contact ring is within the second layer, wherein the well contact ring encloses an enclosed area, and wherein the well rows are within the enclosed area;
   a transistor layer positioned in a third layer above and parallel to the first layer and second layer, wherein the transistor layer comprises a dielectric material, and wherein the second layer is between the first layer and the third layer;
   transistors within the transistor layer, wherein adjacent ones of the transistors have opposite polarities;
   at least one ring-enclosed contact above and contacting the deep well structure, wherein the ring-enclosed contact is positioned within the enclosed area and has a greater height above the deep well structure than the well rows and the well contact ring; and
   a well contact connection connected to the well contact ring and the ring-enclosed contact, wherein the well contact connection is positioned on the transistor layer in a fourth layer parallel to the first layer, the second layer, and the third layer, and wherein the third layer is between the second layer and the fourth layer.

16. The structure according to claim 15, wherein the at least one ring-enclosed contact comprises a plurality of ring-enclosed contacts, and wherein all the ring-enclosed contacts are within the enclosed area.

17. The structure according to claim 16, wherein a pattern of the ring-enclosed contacts within the enclosed area corresponds to a biasing voltage pattern in the deep well structure.

18. The structure according to claim 15, wherein the well contact ring is located only within the second layer, and wherein the ring-enclosed contact extends from the deep well structure through the transistor layer.

19. The structure according to claim 15, wherein the well contact connection extends from the well contact ring through the transistor layer into the fourth layer, and wherein the well contact connection extends within the fourth layer along a surface of the transistor layer.

20. The structure according to claim 15, wherein the ring-enclosed contact is positioned to interrupt one of the well rows.

* * * * *